United States Patent
Lynch

(10) Patent No.: US 8,522,425 B2
(45) Date of Patent: Sep. 3, 2013

(54) ASSEMBLY TECHNIQUES FOR ELECTRONIC DEVICES HAVING COMPACT HOUSING

(75) Inventor: Stephen Brian Lynch, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/240,494

(22) Filed: Sep. 29, 2008

(65) Prior Publication Data
US 2010/0077607 A1    Apr. 1, 2010

(51) Int. Cl.
*H05K 3/34* (2006.01)
*H05K 3/20* (2006.01)
*H05K 3/30* (2006.01)

(52) U.S. Cl.
USPC ............ 29/840; 29/831; 29/832; 29/839

(58) Field of Classification Search
USPC ............ 29/840, 831, 832, 838, 839, 843, 29/739
See application file for complete search history.

(56) References Cited

U.S. PATENT DOCUMENTS

| | | | | |
|---|---|---|---|---|
| 3,216,643 A | * | 11/1965 | De Verter | 228/37 |
| 3,573,707 A | * | 4/1971 | Reynolds | 174/263 |
| 3,851,145 A | * | 11/1974 | Fukanaga | 219/236 |
| 4,903,169 A | * | 2/1990 | Kitagawa et al. | 361/818 |
| 4,934,256 A | * | 6/1990 | Moss et al. | 454/61 |
| 5,054,193 A | * | 10/1991 | Ohms et al. | 29/840 |
| 5,234,157 A | * | 8/1993 | Fletcher et al. | 228/219 |
| 5,414,223 A | * | 5/1995 | Suski et al. | 174/262 |
| 5,679,929 A | * | 10/1997 | Greenfield et al. | 174/261 |
| 5,740,730 A | * | 4/1998 | Thompson, Sr. | 101/127 |
| 5,886,878 A | * | 3/1999 | Khadem et al. | 361/770 |
| 5,942,078 A | * | 8/1999 | Abrahamson | 156/378 |
| 6,165,885 A | * | 12/2000 | Gaynes et al. | 438/612 |
| 6,181,009 B1 | * | 1/2001 | Takahashi et al. | 257/735 |
| 6,612,023 B1 | * | 9/2003 | Lichtenwalter et al. | 29/840 |
| 7,510,405 B1 | | 3/2009 | Prest | |
| 7,515,431 B1 | | 4/2009 | Zadesky et al. | |
| 7,699,208 B2 | * | 4/2010 | Forti et al. | 228/51 |

* cited by examiner

*Primary Examiner* — David Angwin
(74) *Attorney, Agent, or Firm* — Dorsey & Whitney LLP

(57) ABSTRACT

A method for assembling an electronic device comprises inserting a thermal element into an electrical connector contained within a special volume defined by a constricted enclosure that comprises a housing of the electronic device. The spatial volume contains a printed circuit board and the electrical connector includes internal electrical contacts that are positioned proximate to solder connection pads on the printed circuit board when the electrical connector and the printed circuit board are contained within the constricted enclosure. Insertion of the thermal element heats the internal electrical contacts so that solder on the solder connection pads reflows to form solder connections respectively between the internal electrical contacts and the solder connection pads. Thereafter, the thermal element is removed from the electrical contact.

22 Claims, 8 Drawing Sheets

ASSEMBLY TECHNIQUES FOR ELECTRONIC DEVICES HAVING COMPACT HOUSING

BACKGROUND OF THE INVENTION

An electronic device typically has an external housing which is made of plastic or metal. Within the external housing are various electrical components that are interconnected, such as with wires or solder connections. As portable electronic devices become smaller, the density of electrical components within housings of such electronic devices increases which makes assembly of such electronic devices even more tedious.

Conventionally, separate electrical components of an electrical device need to be electrically connected, such as through use of solder connections. These solder connections are formed using solder equipment before the external housing encloses the electrical components. However, since electronic devices continue to get smaller, there is a continuing need for improved approaches to assembly and interconnect separate electrical components to be enclosed by an electronic device housing.

SUMMARY OF THE INVENTION

The invention pertains to improve techniques for assembling electronic devices within housings. The improved techniques enable distinct electrical components of an assembly to be separately inserted into a tightly constrained enclosure. After the separate electrical components have been inserted into the housing, the separate electrical components can be electrically connected. Advantageously, the improved techniques enable electrical components of an assembly to be separately inserted into a tightly constrained enclosure when a sub-assembly of such products prior to insertion is not practicable or feasible.

The invention may be implemented in numerous ways, including, but not limited to, as a system, device, apparatus, or method. Example embodiments of the present invention are discussed below.

As a method for assembling an electronic device having a constricted enclosure, one embodiment of the invention can, for example, include at least: providing a constricted enclosure including an electrical connector and a printed circuit board, where the electrical connector includes internal electrical contacts that are positioned proximate to solder connection pads on the printed circuit board when the electrical connector and the printed circuit board are contained within the constricted enclosure; inserting a thermal element into the electrical connector to heat the internal electrical contacts so that solder provided on the solder connection pads reflows to form solder connections respectively between the internal electrical contacts and the solder connection pads; and thereafter removing the thermal element from the electrical connector.

As a method for assembling an electronic device having a constricted enclosure, another embodiment of the invention can, for example, include at least: providing a constricted enclosure including an electrical connector and a substrate for electronic components, where the electrical connector includes internal electrical contacts that are positioned adjacent solder connection pads on the substrate when the electrical connector and the substrate are positioned within the constricted enclosure, the electrical connector further including an opening to receive and establish an electrical connection with a counterpart connector; inserting a probe into the opening of the electrical connector to cause heating of solder provided on the solder connection pads thereby forming solder connections respectively between the internal electrical contacts of the electrical connector and the solder connection pads of the substrate; and thereafter removing the probe from the opening of the electrical connector.

Another embodiment of the invention can pertain to an electronic device assembled in accordance with either the above-noted methods for assembling an electronic device.

As an electronic device assembly station, one embodiment of the invention can, for example, include at least: an external housing for a portable electronic device, the external housing including an electrical connector and a substrate for electronic components, where the electrical connector includes electrical contacts that are positioned adjacent solder connection pads on the substrate when the electrical connector and the substrate are contained within the external housing, the electrical connector further including a connector opening to receive and establish an electrical connection with a counterpart connector, the connector opening being adjacent a first housing opening to allow insertion of the counterpart connector into the connector opening; and means for inducing heat to the solder at the solder connection pads from internal to the external housing by way of the first housing opening and the connector opening.

As a method for assembling an electronic device having a confined housing, one embodiment of the invention can, for example, include at least: providing a confined housing having an opening for an electrical connector, the confined housing including at least a first electrical component and a second electrical component, the first electrical component having at least a first connection area, the second electrical component having at least a second connection area, the first connection area and the second connection area are aligned proximate one another when placed within the confined housing, at least one of the first connection area and the second connection area have a quantity of solder; inserting a probe into the opening of confined housing for the electrical connector to cause heating of at least a portion of the quantity of solder thereby forming solder connections respectively between the first connection area and the second connection area; and thereafter removing the probe from the opening of the confined housing.

Various aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, in which.

DETAILED DESCRIPTION OF THE INVENTION

The invention pertains to improve techniques for assembling electronic devices within housings. The improved techniques enable distinct electrical components of an assembly to be separately inserted into a tightly constrained enclosure. After the separate electrical components have been inserted into the housing, the separate electrical components can be electrically connected. Advantageously, the improved techniques enable electrical components of an assembly to be separately inserted into a tightly constrained enclosure when a sub-assembly of such products prior to insertion is not practicable or feasible.

In one embodiment, the invention enables assembly of an electronic device including at least a printed circuit board and an electrical connector within a tightly constrained housing, whereby the printed circuit board and the electrical connector can be soldered together after being separately inserted into the tightly constrained housing.

The invention is suitable for a wide variety of electronic devices that make use of a constrained enclosure or housing. The invention is, however, particularly well suited for portable electronic devices. Examples of portable electronic devices include portable media players, mobile communication devices (e.g., mobile telephones, pagers, etc.), device controllers (e.g., remote controllers), or personal digital assistants.

Embodiments of the invention are discussed below with reference to FIGS. 1A-6C. However, those skilled in the art will readily appreciate that the detailed description given herein with respect to these figures is for explanatory purposes as the invention extends beyond these limited embodiments.

Figure 1A:
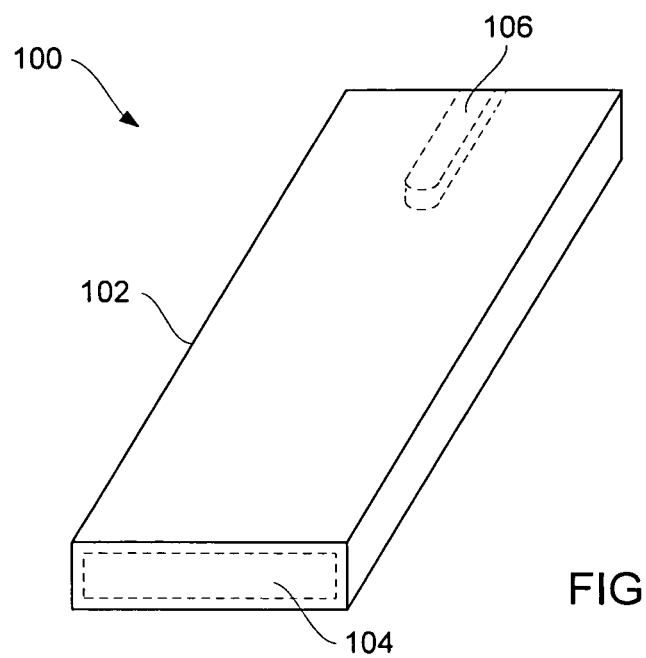
FIGS. 1A and FIG. 1B are perspective views of a portable electronic device 100 according to one embodiment of the invention.
Figure 1B:
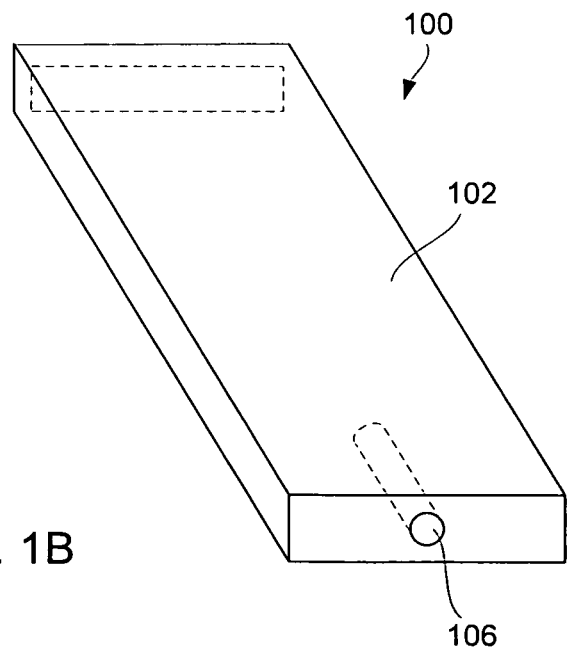

FIG. 1A is a rear perspective view of a portable electronic device 100 and FIG. 1B is a front perspective view of the portable electronic device 100, according to one embodiment of the invention. The portable electronic device 100 has a housing 102 that sets an outer configuration and appearance for the portable electronic device 100. The housing 102 also serves to enclosed electrical components of the portable electronic device. The housing 102 includes an opening 104 at one end that permits electrical components to be inserted into the housing 102. The housing 102 can also include a connector opening 106 (connector receptacle) for receiving a removable connector. The removable connector can, for example, be a peripheral connector (e.g., USB connector), an audio jack, or a power plug. Although the housing 102 has a rectangular shape, it should be understood that the shape can vary widely, such as due to size, type, design, and/or materials.

For design and/or manufacturing reasons, it may be important to insert separate components into the housing 102 for the portable electronic device 100. However, doing so can lead to a difficultly in electrically interconnecting the separate components after they have been provided within the housing 102, particularly when the housing 102 is constrained to be aggressively small. For example, in a tightly constrained housing, if the interconnecting is done with solder connections, there may not be adequate clearance to permit conventional soldering techniques to be utilized. Hence, according to embodiments of the invention, techniques for electrically interconnecting separate components after the components are provided within the housing 102 are discussed below.

Figure 2:
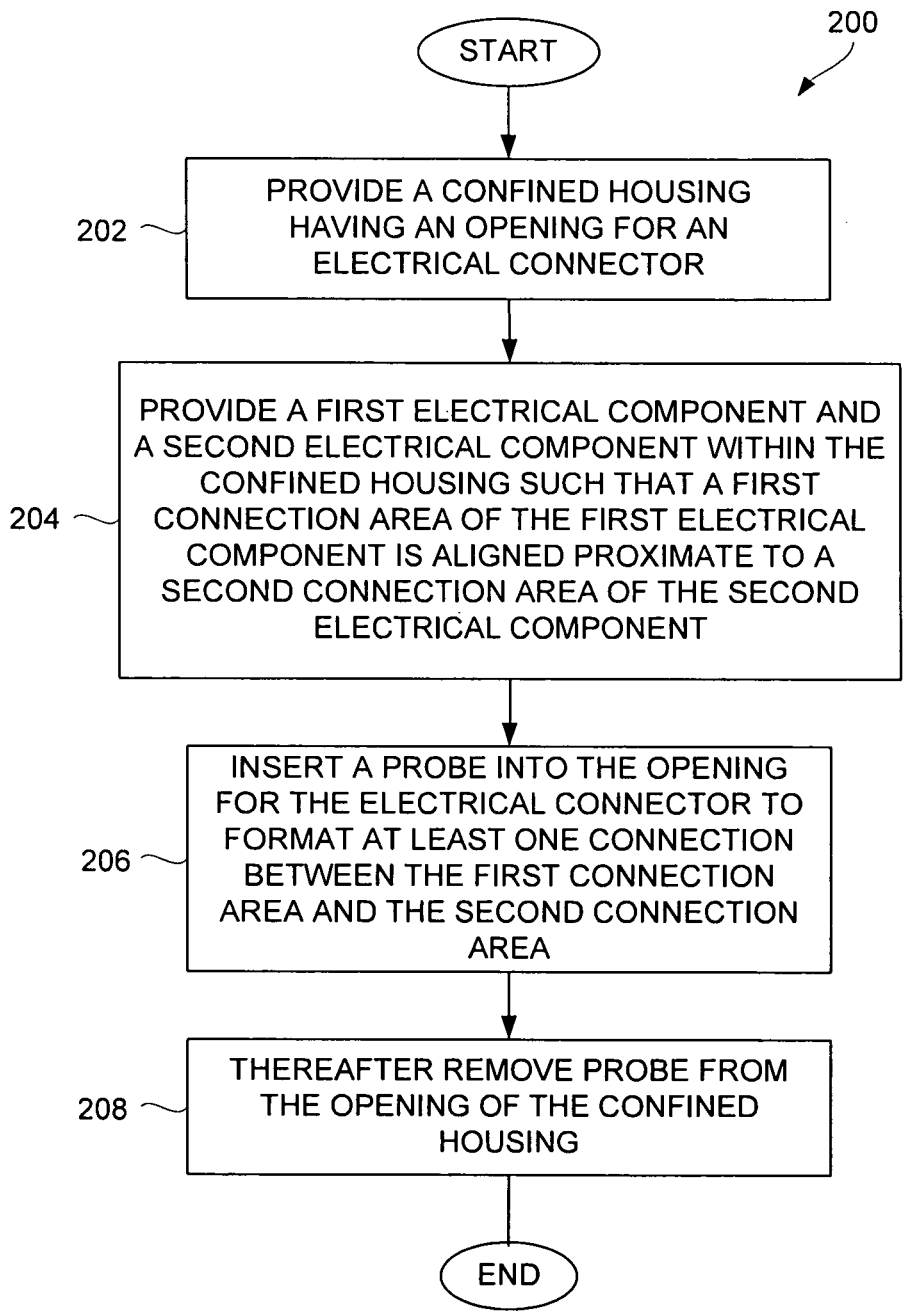
FIG. 2 is a flow diagram of a device assembly process according to one embodiment of the invention.

FIG. 2 is a flow diagram of a device assembly process 200 according to one embodiment of the invention. The device assembly process 200 can represent a process to assemble portions of an electronic device. The device assembly process 200 is advantageous for assembly of components of an electronic device, such as a portable electronic device, within a confined housing.

The device assembly process 200 can provide 202 a confined housing for the electronic device being assembled. The confined housing can represent an outer housing for the electronic device and provides an external appearance for the electronic device. The confined housing, in one embodiment, has an opening for an electrical connector. In other words, the electronic device being formed has a housing that contains an opening that is suitable to receive an electrical connector. Examples of electrical connectors that can be received in an opening in the confined housing include peripheral device plugs (e.g., USB connector), audio jacks, power plug, etc.

Next, a first electrical component and a second electrical component can be provided 204 within the confined housing. Here, the first electrical component and the second electrical component are, for example, inserted into the confined housing. Typically, the confined housing includes an opening (e.g., opening 104) through which the first and second electrical components can be provided 204 within the confined housing. After the first electrical component and the second electrical component are provided 204 within the housing, a first connection area of the first electrical component is aligned proximate to second connection area of the second electrical component. More particularly, since the first electrical component and the second electrical component are to be electrically interconnected, the respective connection areas of these electrical components are appropriately positioned so that interconnections can be established between the respective connection areas after the first and second electrical components have been inserted into the confined housing. The first electrical component can have additional connection areas that can be likewise respectively aligned proximate to additional connection areas of the second electrical component.

After the first and second electrical components have been provided 204 within the confined housing, a probe can be inserted 206 into the opening for the electrical connector. The probe, when provided within the opening for the electrical connector, can operate to facilitate formation of at least one connection between the first connection area and the second connection area. The at least one connection formed can provided at least electrical connection and possible also mechanical connection. In one implementation, the at least one connection is a solder connection. After the at least one connection has been formed, the probe can be removed 208 from the opening for the electrical connector in the confined housing. Following the block 208, the device assembly process 200 can end.

Figure 3:
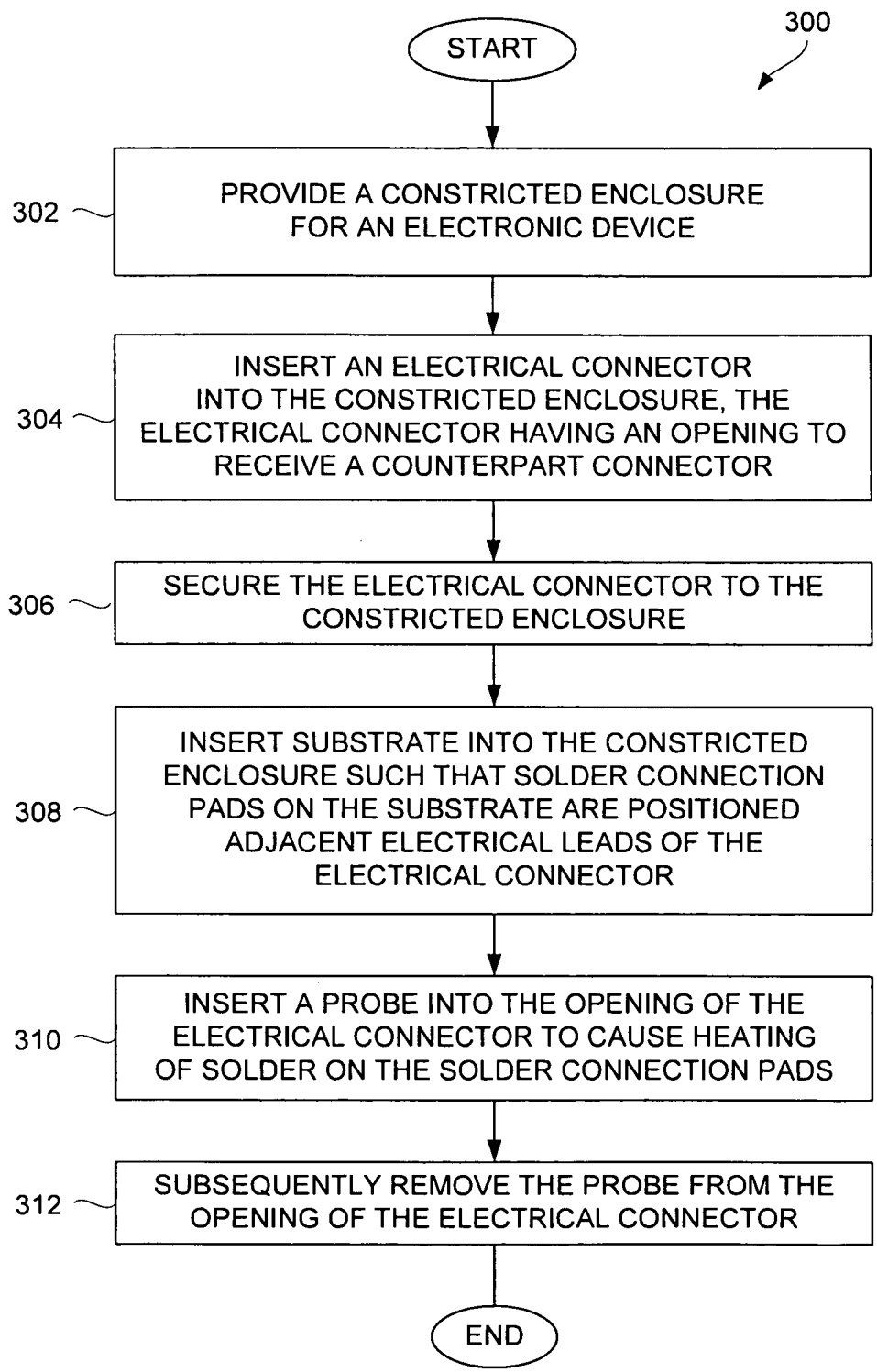
FIG. 3 is a flow diagram of a device assembly process according to one embodiment of the invention.

FIG. 3 is a flow diagram of a device assembly process 300 according to one embodiment of the invention. The device assembly process 300 can represent a process to assemble portions of an electronic device. The device assembly process 300 serves to assemble portions of an electronic device, such as a portable electronic device, having a constricted enclosure (e.g., housing).

The device assembly process 300 can initially provide 302 a constricted enclosure for an electronic device. As an example, the constricted enclosure can represent an outer housing for the electronic device. The housing 102 for the portable electronic device 100 illustrated in FIGS. 1A and 1B is one example of the constricted enclosure.

Next, an electrical connector is inserted 304 into the constricted enclosure. The electrical connector can have leads (i.e., internal electrical contacts) that facilitate electrical connection to other components. The electrical connector has an opening that is capable of receiving a removable counterpart connector. The electrical connector is also secured 306 within the constricted enclosure. The constricted enclosure can include an opening that corresponds to the opening of the electrical connector, so that the opening of the electrical connector remains externally accessible even after being provided within the constricted enclosure. The electrical connector can be secured 306 to the constricted enclosure using a variety of different techniques, including adhesive or mechanically means, such as snaps, detents, screws and/or bolts.

Next, a substrate can be inserted 308 into the constricted enclosure. The substrate is inserted 308 into the constricted enclosure such that solder connection pads on the substrate are positioned adjacent to the leads of the electrical connector. In one embodiment, the leads of the electrical connector can be biased against the solder connection pads on the substrate. Additionally, in one embodiment, solder (e.g., solder balls) can be pre-deposited on the solder connection pads of the substrate before the substrate is inserted 308.

Thereafter, a probe can be inserted 310 into the opening of the electrical connector. The probe can cause heating of solder previously provided on the solder connection pads of the substrate. Consequently, the probe causes solder connections to be respectively formed between the leads of the electrical connector and the solder connection pads of the substrate. After the appropriate solder connections have been established, the probe can be subsequently removed 312 from the opening of the electrical connector. Following the block 312, the device assembly process 300 can end. However, further device assembly operation can be performed to insert additional electrical components into the constricted housing and/or to close an opening (e.g., opening 114) in the constricted enclosure, such as with an end cap, through which electrical components are inserted.

Figure 4:
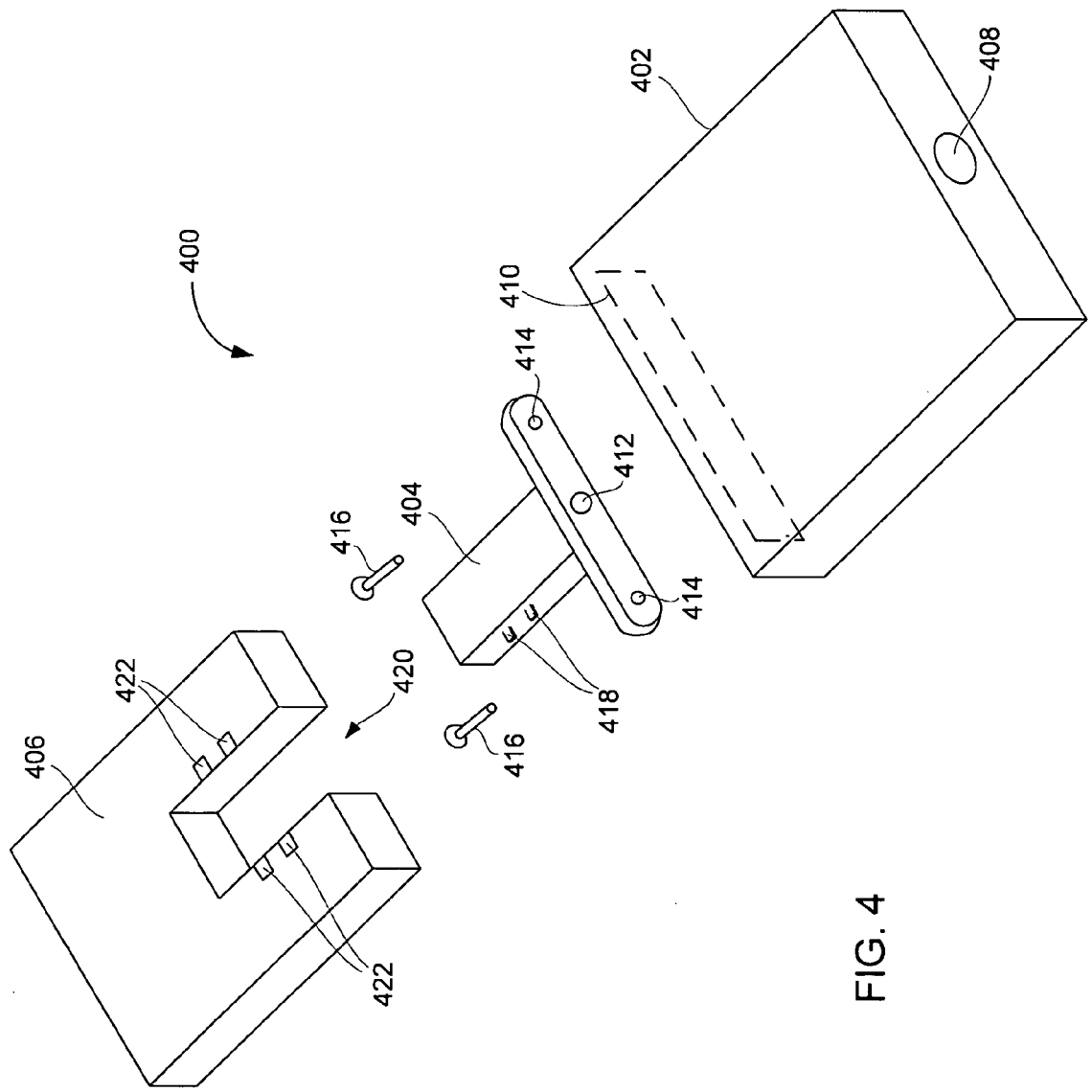
FIG. 4 is an assembly view of an electronic device according to one embodiment of the invention.

FIG. 4 is an assembly view of an electronic device 400 according to one embodiment of the invention. The electronic device 400 is assembled from a housing 402, an electrical connector 404 and a Printed Circuit Board (PCB) 406.

The housing 402 has a connector opening 408 at one end of the housing 402 and an insertion opening 410 at another end of the housing 402. In one embodiment, the housing 402 is a unitary structure with only the connector opening 408 and the insertion opening 410. The electrical connector 404 can be inserted into the housing 402 via the opening 410 of the housing 402. The electrical connector 404 has an opening 412 for receiving a counterpart electrical connector (not shown). After the electrical connector 404 is inserted into the housing 402, openings 414 in a forward section of the electrical connector 404 can be adjacent to an inner surface of the front end of the housing 402. Screws 416 can be used to secure the electrical connector 404 within the housing 402. In addition, once placed within the housing, the opening 412 of the electrical connector 404 is aligned with the connector opening 408 of the housing 402. The electrical connector 404 also includes exposed leads 418.

Next, the PCB 406 can be inserted into the housing 402 via the opening 410 of the housing 402. The PCB 406 has a notch or cut-out 420 so that when inserted into the housing 402 a rearward section of the electrical connector 404 can fit within the notch or cut-out 420. The PCB 406 can include a plurality of solder pads 422. The solder pads 422 can include additional solder (e.g., solder bumps) for facilitating solder connections. The solder pads 422 can be positioned proximate to the notch or cut-out 420. For example, each of the exposed leads 418 of the electrical connector 404 can be positioned such that they couple respectively to one of the solder pads 422. In one implementation, the exposed leads 418 can be considered such that the leads 418 are bias against the solder pads 422.

Once the electronic device 400 is assembled, the housing 402 is so tightly constrained, there is no conventional way to solder the exposed leads 418 of the electrical connector 404 to respective ones of the solder pads 422. For instance, a soldering apparatus cannot gain access to the solder pads 422 once provided within the housing 402.

Figure 5A:
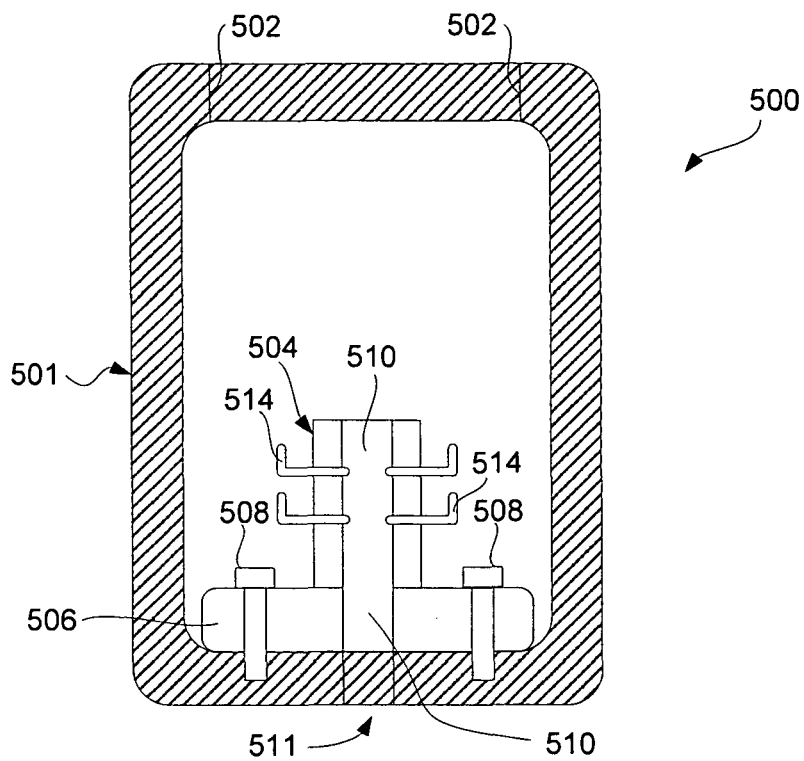
FIGS. 5A and 5B are cross-sectional views of an electronic device according to one embodiment of the invention.
Figure 5B:
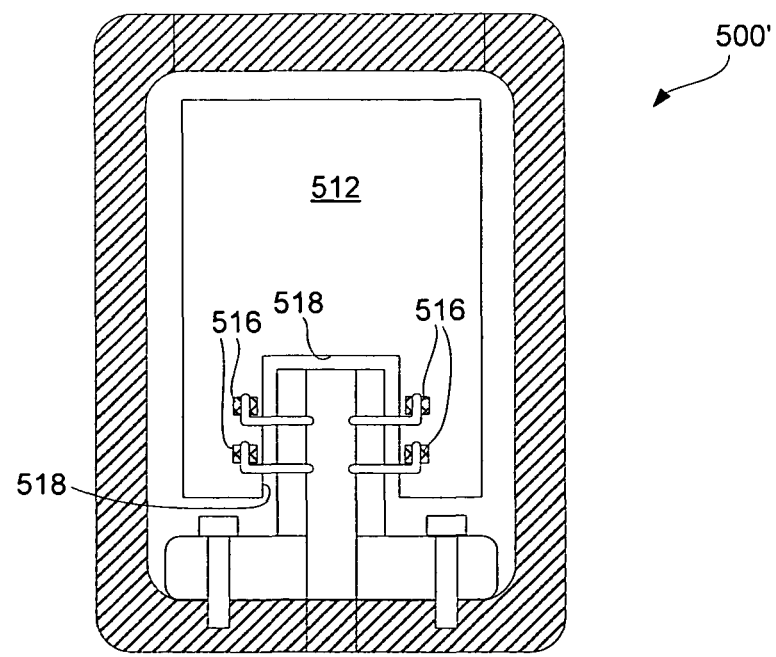

FIGS. 5A and 5B are cross-sectional views of an electronic device 500 according to one embodiment of the invention. The electronic device 500 has a housing 501 that contains various electrical components. The housing 501 includes an opening 502 at one side of the housing 501. For example, the opening 502 can be similar to the opening 104 illustrated in FIGS. 1A and 1B. The opening 502 allows the various electrical components of the electronic device 500 to be inserted into the housing 501. As shown in FIG. 5A, an electrical connector 504 has been inserted in the housing 501. The electrical connector 504 has a front end 506 (forward section) that is secured to an inner surface of the housing 501. Screws 508 can be used to secure the front end 506 of the electrical connector 504 to the inner surface of the housing 501. The electrical connector 504 has a central opening 510 that extends through all or a substantial portion of the electrical connector 504. The central opening 510 is designed to receive a removable electrical connector to make one or more electrical connections between the removable electrical connector and the electrical connector 504. The housing 501 also has an opening 511 that corresponds or aligns with the central opening 510. Accordingly, a removable electrical connector (e.g., jack, plug, etc.) can be inserted into the central opening 510 via the opening 511. Exposed to the central opening 510 are leads 514 that facilitate connection to other electrical components within the housing 501. For example, one electrical component that can be connected to the electrical connector 504 is a substrate, such as a Printed Circuit Board (PCB).

In FIG. 5B, the electronic device 500' represents a configuration of the electronic device 500 after a Printed Circuit Board (PCB) 512 has been inserted. As shown in FIG. 5B, the PCB 512 can be inserted into the housing 501 via the opening 502 after the electrical connector 504 has already been inserted into the housing 501. The PCB 512 can include connection pads 516, such as solder connection pads. The leads 514 of the electrical connector 504 can be adjacent or aligned with the connection pads 516 of the PCB 512. In one embodiment, the leads 514 can further be biased downward against respective ones of the connection pads 516 to provide a reliable connection. The PCB 512 can include a notch 518 that enable the PCB 512 to fit around the electrical connector 504.

Although not shown in FIGS. 5A and 5B, other electrical components can be provided within the housing 501 and can electrically connect with the electrical connector 504 and thus electrically connect to external devices via a removable electrical connector inserted into the central opening 510.

Figure 6A:
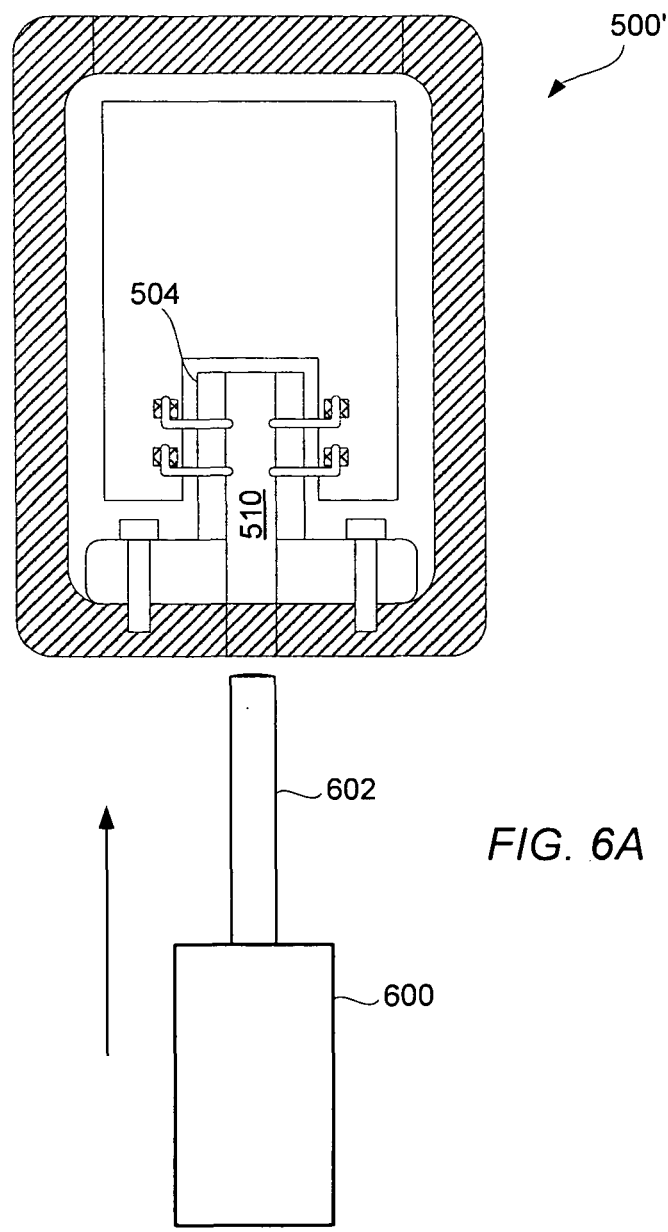
FIGS. 6A and 6B are cross-sectional views of the electronic device for assembly processing according to one embodiment of the invention.
Figure 6B:
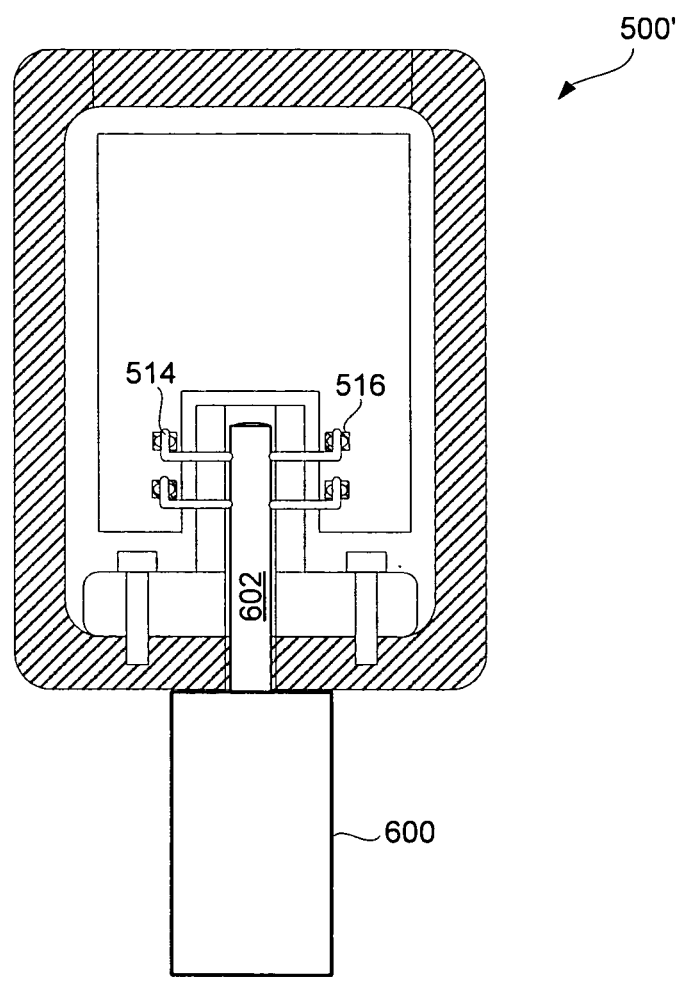

FIGS. 6A and 6B are cross-sectional views of the electronic device 500' for assembly processing according to one embodiment of the invention. As shown in FIG. 6A, a probe 600 can be inserted into the central opening 510 of the electrical connector 504. As shown in FIG. 6B, a forward portion 602 of the probe 600 is inserted into the central opening 510. With the forward portion 602 of the probe 600 inserted into the central opening 510, the leads 514 can be soldered to the respective connection pads 516. More particularly, the probe 600 can apply or induce heating of the leads 514. The probe 600 can apply or induce heating of the leads 514 by heating the probe 600. Alternatively, the probe 600 can apply or induce heating by supplying electrical energy that also results in heating of the leads 514. As the leads 514 are heated, solder provided on the connection pads 516 is heated by way of the leads 514. Consequently, the solder provided on the connection pads 516 can reflow (e.g., melt) to establish soldered connections between the leads 514 and the connection pads 516. The solder pads 516 can be pre-provided with additional solder on the connection pads 516. Hence, the heating of the leads 514 can cause heating of the additional solder to thereby forming the soldered connections.

Figure 6C:
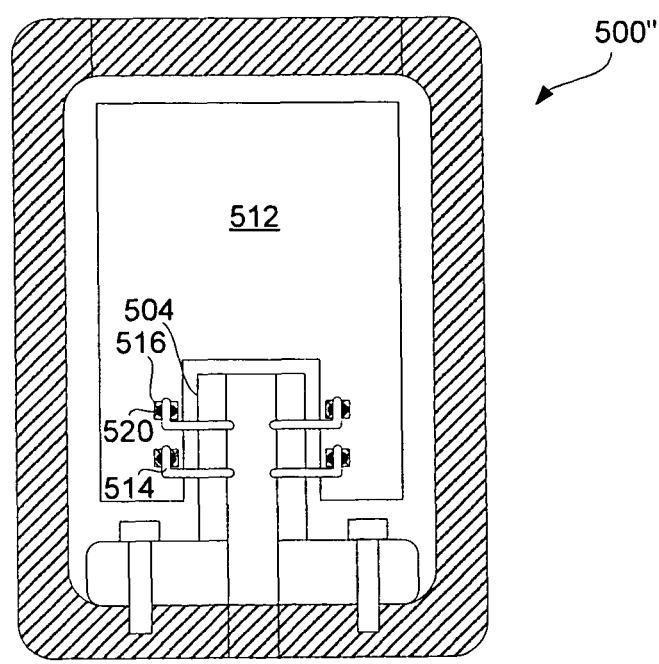
FIG. 6C is a cross-sectional view of the electronic device for assembly processing according to one embodiment of the invention.

FIGS. 6C is a cross-sectional view of the electronic device 500″ for assembly processing according to one embodiment of the invention. The electronic device 500″ represents the electronic device 500′ shown in FIG. 6B after the probe 600 has been inserted and then later removed from the central opening 510. As shown in FIG. 6C, solder connections 520 are established between the leads 514 of the electrical connector 504 and the solder pads 516 of the PCB 512.

A portable electronic device as discussed herein may be a hand-held electronic device. The term hand-held generally means that the electronic device has a form factor that is small enough to be comfortably held in one hand. A hand-held electronic device may be directed at one-handed operation or two-handed operation. In one-handed operation, a single hand is used to both support the device as well as to perform operations with the user interface during use. In two-handed operation, one hand is used to support the device while the other hand performs operations with a user interface during use or alternatively both hands support the device as well as perform operations during use. In some cases, the hand-held electronic device is sized for placement into a pocket of the user. By being pocket-sized, the user does not have to directly carry the device and therefore the device can be taken almost anywhere the user travels. Even smaller, and thus more portable device, are wearable electronic devices.

The advantages of the invention are numerous. Different embodiments or implementations may, but need not, yield one or more of the following advantages. One advantage of certain embodiments of the invention is that very compact housings for portable electronic devices can be utilized. Separate components can be inserted into compact housing for enhanced density and then interconnect after being provided with a compact housing. Another advantage of certain embodiments of the invention is that an electrical connector (e.g., receptacle) provided within a housing for an electronic device can be used to interconnect (e.g., solder) components within the housing.

The various aspects, features, embodiments or implementations of the invention described above can be used alone or in various combinations.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method for assembling an electronic device, the method comprising:

inserting a thermal element into an electrical connector contained within a spatial volume defined by a constricted enclosure that comprises a housing of the electronic device, the spatial volume defined by the constricted enclosure also containing a printed circuit board, wherein the electrical connector includes internal electrical contacts that are positioned proximate to solder connection pads on the printed circuit board when the electrical connector and the printed circuit board are contained within the constricted enclosure, thereby heating the internal electrical contacts so that solder on the solder connection pads reflows to form solder connections respectively between the internal electrical contacts and the solder connection pads; and thereafter removing the thermal element from the electrical connector.

2. A method as recited in claim 1, wherein the electrical connector is an audio connector.

3. A method as recited in claim 1, wherein the electrical connector has a jack opening, and wherein the thermal element is inserted within the jack opening for the electrical connector.

4. A method as recited in claim 1, wherein when the electrical connector and the printed circuit board are contained within the constricted enclosure, the internal electrical contacts are positioned proximate to and respectively biased against the solder connection pads on the printed circuit board.

5. A method as recited in claim 1, wherein the constricted enclosure includes a jack opening at a first end and an assembly opening at a second end, wherein the electrical connector is inserted into the constricted enclosure via the assembly opening so as to be adjacent the jack opening, and wherein the printed circuit board is inserted into the constricted enclosure via the assembly opening so that the solder connection pads are positioned adjacent the internal electrical contacts of the electrical connector.

6. A method as recited in claim 5, wherein the electrical connector has a jack opening, and wherein the thermal element is inserted within the jack opening for the electrical connector.

7. A method as recited in claim 6, wherein the thermal element is metal that is heated using electrical energy to a temperature greater than the melting point of solder.

8. A method as recited in claim 6, wherein when the electrical connector and the printed circuit board are contained within the constricted enclosure, the internal electrical contacts are positioned proximate to and respectively biased against the solder connection pads on the printed circuit board.

9. A method for assembling an electronic device the method comprising:

inserting a probe into an opening of an electrical connector contained within a spatial volume defined by a constricted enclosure that comprises a housing of the electronic device, the spatial volume defined by the constricted enclosure also containing a substrate, wherein the electrical connector includes internal electrical contacts that are positioned proximate to solder connection pads on the substrate when the electrical connector and the substrate are contained within the constricted enclosure, thereby causing heating of solder on the solder connection pads thereby forming solder connections respectively between the internal electrical contacts of the electrical connector and the solder connection pads of the substrate; and thereafter removing the probe from the opening of the electrical connector.

10. A method as recited in claim 9, wherein the heating of the solder on the solder connection pads causes the solder to reflow.

11. A method as recited in claim 9, wherein the probe, when inserted into the opening of the electrical connector, is hot or heated, thereby serving to cause heating of the solder on the solder connection pads and thermally coupled to the internal electrical contacts of the electrical connector.

12. A method as recited in claim 9, wherein the probe, when inserted into the opening of the electrical connector, causes heating of the solder thermally coupled to the internal electrical contacts of the electrical connector through use of thermal conduction.

13. A method as recited in claim 9, wherein the probe, when inserted into the opening of the electrical connector, causes heating of the solder electrically coupled to the internal electrical contacts of the electrical connector through use of electrical energy.

14. A method as recited in claim 9, wherein when the electrical connector and the substrate are contained within the constricted enclosure, the internal electrical contacts are respectively biased against the solder connection pads on the substrate.

15. A method as recited in claim 9, wherein the constricted enclosure includes the opening for the counterpart connector at a first end and an assembly opening at a second end, wherein the electrical connector is inserted into the constricted enclosure via the assembly opening so as to be adjacent the opening for the counterpart connector, and wherein the substrate is inserted into the constricted enclosure via the assembly opening so that the solder connection pads are positioned adjacent the internal electrical contacts.

16. A method as recited in claim 15, wherein the probe, when inserted into the opening of the electrical connector, is hot or heated, thereby serving to cause heating of the solder on the solder connection pads and thermally coupled to the internal electrical contacts of the electrical connector.

17. A method as recited in claim 9, wherein the electrical connector is an audio connector, and wherein the counterpart connector is an audio jack.

18. A method as recited in claim 9, wherein the electronic device is a portable electronic device.

19. A method for assembling an electronic device the method comprising:
    inserting a probe into an opening of a spatial volume defined by a confined housing for an electrical connector, the confined housing comprising a housing of the electronic device, the spatial volume defined by the confined housing including a printed circuit board and at least a first electrical component with at least a first connection area and a second electrical component with a second connection area, wherein the first connection area and the second connection area are positioned proximate to each other when the first electrical component and the second electrical component are contained within the confined housing, thereby causing heating of at least a portion of a quantity of solder on at least one of the first connection area and the second connection area thereby forming solder connections respectively between the first connection area and the second connection area; and
    thereafter removing the probe from the opening of the spatial volume defined by the confined housing.

20. A method as recited in claim 1, wherein the method further comprises:
    placing, prior to the inserting, the electrical connector and the printed circuit board in the spatial volume defined by the constricted enclosure.

21. A method as recited in claim 1, wherein the method further comprises:
    placing, prior to the inserting, at least one of the electrical connector and the printed circuit board in the spatial volume defined by the constricted enclosure.

22. A method as recited in claim 1, wherein the method further comprises:
    placing the electrical connector in the spatial volume defined by the constricted enclosure;
    securing the electrical connector to the constricted enclosure; and
    thereafter placing the printed circuit board in the spatial volume defined by the constricted enclosure.

* * * * *